(12) United States Patent
Jiang et al.

(10) Patent No.: US 12,255,621 B2
(45) Date of Patent: Mar. 18, 2025

(54) RADIO FREQUENCY FILTER

(71) Applicant: EPICMEMS(XIAMEN) CO., LTD., Fujian (CN)

(72) Inventors: Jiang Jiang, Fujian (CN); Ping Li, Fujian (CN); Wei Wang, Fujian (CN); Mingguo Zhu, Fujian (CN); Nianchu Hu, Fujian (CN); Bin Jia, Fujian (CN)

(73) Assignee: EPICMEMS(XIAMEN) CO., LTD., Fujian (CN)

( * ) Notice: Subject to any disclaimer, the term of this patent is extended or adjusted under 35 U.S.C. 154(b) by 296 days.

(21) Appl. No.: 17/790,382

(22) PCT Filed: Jan. 20, 2020

(86) PCT No.: PCT/CN2020/073288
§ 371 (c)(1),
(2) Date: Jun. 30, 2022

(87) PCT Pub. No.: WO2021/146855
PCT Pub. Date: Jul. 29, 2021

(65) Prior Publication Data
US 2023/0039933 A1 Feb. 9, 2023

(51) Int. Cl.
*H03H 9/54* (2006.01)
*H03H 9/13* (2006.01)
*H03H 9/17* (2006.01)

(52) U.S. Cl.
CPC ............ *H03H 9/547* (2013.01); *H03H 9/131* (2013.01); *H03H 9/17* (2013.01)

(58) Field of Classification Search
CPC .......... H03H 9/547; H03H 9/131; H03H 9/17; H03H 9/02157; H03H 9/0523; H03H 9/1014; H01L 23/28

USPC .......................... 333/133, 186–188, 193–196
See application file for complete search history.

(56) References Cited

U.S. PATENT DOCUMENTS

| | | | |
|---|---|---|---|
| 2017/0250669 A1* | 8/2017 | Kuroyanagi | H03H 9/02574 |
| 2017/0288645 A1 | 10/2017 | Park et al. | |
| 2018/0062608 A1 | 3/2018 | Lee et al. | |
| 2019/0123040 A1 | 4/2019 | Fukahori | |

FOREIGN PATENT DOCUMENTS

| | | |
|---|---|---|
| CN | 106301283 A | 1/2017 |
| CN | 106783814 A | 5/2017 |
| CN | 107276558 A | 10/2017 |
| CN | 207637777 U | 7/2018 |

OTHER PUBLICATIONS

PCT International Search Report for PCT Application No. PCT/CN2020/073288 mailed Oct. 27, 2020 (6 pages, with English translation).
PCT Written Opinion for PCT Application No. PCT/CN2020/073288 mailed Oct. 27, 2020 (3 pages).

* cited by examiner

*Primary Examiner* — Jorge L Salazar, Jr.
(74) *Attorney, Agent, or Firm* — Merchant & Gould P.C.

(57) ABSTRACT

The present disclosure provides a radio frequency filter, including: a substrate; a supporting electrode protruded on a front surface of the substrate; and a thin film structure formed on the substrate and spaced with the substrate by the supporting electrode. An end surface of a top end of the supporting electrode is in sealing contact with a front surface of the thin film structure.

10 Claims, 11 Drawing Sheets

RADIO FREQUENCY FILTER

CROSS REFERENCE

This application is a National Stage Application of International Application No. PCT/CN2020/073288, filed on Jan. 20, 2020, entitled "RADIO FREQUENCY FILTER", which is incorporated herein by reference in its entirety. To the extent appropriate, a claim of priority is made to the above disclosed application

TECHNICAL FIELD

The present disclosure relates to a technical field of filter, and in particular to a radio frequency filter.

BACKGROUND

With a continuous development of 5G technology, applications and requirements of the radio frequency filter are continuously upgraded, and performance index requirements of the radio frequency filter is continuously increased. According to a transmission mode of a sound wave, the radio frequency filter is generally divided into: a bulk acoustic wave filter and a surface acoustic wave filter. The surface acoustic wave filter generally works below 2.5 G frequency, and the bulk acoustic wave filter works at 1.5 G to 10 G frequency.

There is a certain requirement on a working environment for both the surface acoustic wave filter and the bulk acoustic wave filter in order to maintain a good radio frequency performance index, and it is necessary to prepare a relatively closed cavity (i.e., a protective cavity) for isolating external moisture, particles, stains, etc. from influencing the device. A conventional method is to prepare a protective substrate, which is generally silicon, glass, ceramic, metal housing, etc., then the filter may be isolated and protected by a wafer level bonding, welding, etc., and then the filter may be formed through a series of complicated processes. For example, in order to prepare a protective cavity of a Bulk Acoustic Wave (BAW) filter device, some of the following materials, processes and apparatuses may be used: (1) a double-polished high-resistance silicon wafer used as the protective substrate; (2) a through hole electrode processing by using Through Silicon Via (TSV) and deep hole electrode filling technology; (3) gold used as a wafer bonding and an electrode material; (4) an expensive wafer bonding and a physical vapor deposition apparatus with a lateral deposition capability are required.

Therefore, a use of the existing protective substrate determines that a whole preparation process flow of the radio frequency filter is longer, which is difficult to be implemented. Meanwhile, applications of the above materials, processes and apparatuses cause a preparation cost of a single BAW device to be expensive, which directly influences a large-scale application and a market competitiveness of the product.

SUMMARY

A radio frequency filter is provided, including:
a substrate;
a supporting electrode protruded on a front surface of the substrate; and
a thin film structure formed on the substrate and spaced with the substrate by the supporting electrode.

According to the embodiment of the present disclosure, an end surface of a top end of the supporting electrode is in sealing contact with a front surface of the thin film structure, and the supporting electrode includes:
a first supporting electrode protruded outwardly with respect to the substrate on an edge of the front surface of the substrate, while the first supporting electrode is of an annular closed structure surrounding the edge of the front surface of the substrate; and
a plurality of second supporting electrodes, each second supporting electrode of the plurality of second supporting electrodes is protruded with respect to the substrate on a middle portion of the front surface of the substrate in a certain distribution, and the plurality of second supporting electrodes are surrounded by the first supporting electrode on the middle portion of the front surface of the substrate.

According to the embodiment of the present disclosure, the supporting electrode further includes:
a first seed layer arranged between the first supporting electrode and the substrate;
a plurality of second seed layers, each second seed layer of the plurality of second seed layers is correspondingly arranged between each second supporting electrode of the plurality of second supporting electrodes and the substrate;
wherein a material of the first seed layer and each second seed layer of the plurality of second seed layers include titanium, tungsten, gold, copper or a combination thereof.

According to the embodiment of the present disclosure, the radio frequency filter further includes:
a protective cavity, wherein the protective cavity is a cavity space between the first supporting electrode, the plurality of second supporting electrodes, and the front surface of the substrate;
wherein a distance between the front surface of the substrate and the end surface of the top end of the first supporting electrode is j1, a distance between the front surface of the substrate and the end surface of the top end of each second supporting electrode of the plurality of second supporting electrodes is j2, 10 μm ≤ j1 ≤ 40 μm, 10 μm ≤ j2 ≤ 40 μm; Δj=|j1−j2|, and Δj ≤ 10 μm.

According to the embodiment of the present disclosure, the substrate includes:
a resonant structure corresponding to the protective cavity disposed on the front surface of the substrate;
a plurality of lower electrode layers, each lower electrode layer of the plurality of lower electrode layers corresponds to a lower surface of each second supporting electrode of the plurality of second supporting electrodes, and is inwardly recessed with respect to the front surface of the substrate, a material of the lower electrode layer includes copper, gold, molybdenum, aluminum or a combination thereof;
wherein the resonant structure includes at least:
a piezoelectric layer corresponding to the protective cavity disposed on the front surface of the substrate.

According to the embodiment of the present disclosure, the substrate further includes:
a plurality of spacing layers, each spacing layer of the plurality of spacing layers corresponds to the lower surface of each lower electrode layer of the plurality of lower electrode layers, and is arranged between each lower electrode layer of the plurality of lower electrode layers and the substrate, wherein a material of the spacing layer includes titanium, tungsten, nickel, chromium or a combination thereof.

According to the embodiment of the present disclosure, the thin film structure includes:
- a film layer arranged on the substrate with the supporting electrode formed between the film layer and the substrate, the end surface of the top end of the supporting electrode is in sealing contact with a front surface of the film layer, a thickness of the film layer is m, and $10\ \mu m \leqslant m \leqslant 60\ \mu m$;
- a plurality of through holes, each through hole of the plurality of through holes is arranged corresponding to a middle position of an end surface of a top end of each second supporting electrode of the plurality of second supporting electrodes, and penetrates through the film layer;
- a plurality of leading electrodes, each leading electrode of the plurality of leading electrodes is correspondingly filled in each through hole of the plurality of through holes, a lower end of each leading electrode of the plurality of leading electrodes is in contact with the end surface of the top end of each second supporting electrode of the plurality of second supporting electrodes, an upper end of each leading electrode of the plurality of leading electrodes is laid on a back surface of the film layer, an inner surface of the upper end of each leading electrode of the plurality of leading electrodes is in contact with the back surface of the film layer, a thickness of the upper end of each leading electrode of the plurality of leading electrodes on the back surface of the film layer is y, and $5\ \mu m \leqslant y \leqslant 40\ \mu m$; and
- a plurality of back electrodes, each back electrode of the plurality of back electrodes corresponding to each leading electrode of the plurality of leading electrodes is arranged on an outer surface of the upper end of each leading electrode of the plurality of leading electrodes, and is correspondingly arranged right above the first supporting electrode, a height of the back electrode is b, and $30\ \mu m \leqslant b \leqslant 150\ \mu m$;
wherein an area of the back surface of the film layer is s1, a distribution area of the upper end of each leading electrode of the plurality of leading electrodes on the back surface of the film layer is s2, the number of the plurality of leading electrodes is n, $\Delta s=(n \times s2)/s1$, and $\Delta s \geqslant 0.2$.

According to the embodiment of the present disclosure, the thin film structure further includes:
- a plurality of passivation layers, each passivation layer of the plurality of passivation layers corresponds to each leading electrode of the plurality of leading electrodes, and covers the outer surface of the upper end of each leading electrode of the plurality of leading electrodes;
- a plurality of passivation holes, each passivation hole of the plurality of passivation holes corresponds to each back electrode of the plurality of back electrodes, and is opened in each passivation layer of the plurality of passivation layers.

According to the embodiment of the present disclosure, the thin film structure further includes:
- a plurality of anchoring openings correspondingly arranged above the first supporting electrode along an edge of the film layer, a projection size of the anchoring opening on the back surface of the film layer includes a length c and a width k; $c \geqslant 40\ \mu m$, and $k \geqslant 10\ \mu m$;
- a plurality of anchoring portions, each anchoring portion of the plurality of anchoring portions correspondingly arranged in each anchoring opening of the plurality of anchoring openings, a thickness of the anchoring portion is d, and $5\ \mu m \leqslant d \leqslant 40\ \mu m$.

According to the embodiment of the present disclosure, each anchoring portion of the plurality of anchoring portions includes:
- an anchor end correspondingly arranged in the anchoring opening;
- a fixed end correspondingly arranged on the back surface of the film layer;
- wherein the anchor end and the fixed end are connected with each other and are of an integral design.

According to the embodiment of the present disclosure, the supporting electrode further includes:
- a first sealing structure arranged on an end surface of a top end of the first supporting electrode;
- a plurality of second sealing structures, each second sealing structure of the plurality of second sealing structures corresponds to each second supporting electrode of the plurality of second supporting electrodes, and is arranged on an end surface of a top end of each second supporting electrode of the plurality of second supporting electrodes;
- wherein the first sealing structure and each second sealing structure of the plurality of second sealing structures include a plurality of convex portions or concave portions arranged correspondingly, a height of the convex portion is t, a depth of the concave portion is a, $t \geqslant 1\ \mu m$, and $a \geqslant 1\ \mu m$.

DETAILED DESCRIPTION OF EMBODIMENTS

Figure 1A:
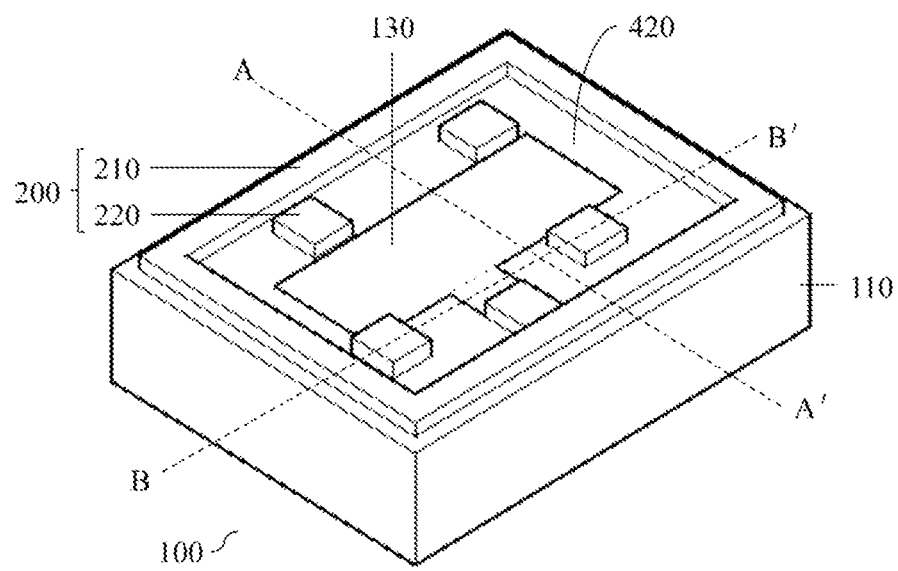
FIG. 1A is an internal perspective diagram of a radio frequency filter not covered with a thin film structure according to an embodiment of the present disclosure.

In order to make objectives, technical solutions and advantages of the present disclosure more apparent, the present disclosure will be described in further detail below with reference to specific embodiments and the accompanying drawings.

As shown in FIG. 1A to FIG. 1C, and FIG. 2A to FIG. 2B, an aspect of the present disclosure provides a radio frequency filter, including: a substrate 110, a supporting electrode 200, and a thin film structure 300;

the supporting electrode 200 is protruded with respect to the substrate 110 on a front surface of the substrate 110;

the thin film structure 300 is formed on the substrate 110 and spaced with the substrate by the supporting electrode 200, and an end surface of a top end of the supporting electrode 200 is in sealing contact with a front surface of the thin film structure 300.

According to the embodiments of the present disclosure, for the radio frequency filter of the present disclosure, the substrate 110 may be all or a part of a wafer substrate. Specifically, for example, when the substrate 110 is all of the wafer substrate, the radio frequency filter of the present disclosure may be a structure of a single radio frequency filter; and when the substrate 110 is a part of the wafer substrate, the radio frequency filter of the present disclosure may be a structure of a single device in an array structure of the radio frequency filter formed by the wafer substrate. The wafer substrate may be a wafer-level substrate with 4 inch, 6 inch, or 8 inch area dimensions, and a material of the wafer-level substrate may be silicon, glass, or group III-V semiconductor material, and the wafer-level substrate is used as a matching substrate of the thin film structure 300 of the present disclosure. The substrate 110 may also be used to provide a formation substrate of the supporting electrode while forming a protective space for a resonant structure of the corresponding radio frequency filter.

In order to effectively seal the substrate 110 and form a protective effect on the resonant structure of the radio frequency filter, the present disclosure provides the supporting electrode 200 formed on the front surface of the substrate 110, which may be formed integrally with the substrate 110. According to the embodiments of the present disclosure, the "front surface" and a subsequent "back surface" are only defined with respect to a location of the resonant structure, i.e. a surface on which the resonant structure is located or a surface facing the resonant structure is referred to as a "front surface" in the present disclosure; a surface in contrary to the "front surface" is referred to as a "back surface".

According to the embodiments of the present disclosure, due to a use of the thin film structure 300, a material of the supporting electrode 200 may be copper, a copper-like material, a copper-like alloy material, or the like, which may greatly reduce a cost. According to the embodiments of the present disclosure, since a resistivity of the copper, the copper-like material or the copper-like alloy material is lower than a resistivity of gold, it is beneficial to reduce an insertion loss of a device, and is beneficial for a diffusion of metal atoms under a high temperature and a high pressure, making a contact interface more blurred. An electrode material contact of the present disclosure may achieve a bonding strength better than a bonding strength of a gold material contact, a better resonance effect and a better sealing strength even compared with the gold material. The copper-like material or the copper-like alloy material means that the material has a property, e.g., a resistivity, similar to copper itself.

The thin film structure 300 has at least one film layer, and is directly laminated on the substrate 110 having the supporting electrode 200 through a film lamination process. The supporting electrode is used to support the thin film structure 300, so as to form a protective space or a resonance space of a resonant structure between the thin film structure 300 and the substrate 110. In order to further effectively seal the device, in the present disclosure, a sealing structure may be provided on an end surface of a top end of the supporting electrode for contact sealing with a front surface of the film layer of the thin film structure 300.

In the present disclosure, a technical bias of "using the thin film structure 300 to replace a conventional protective wafer substrate" in the art is overcome structurally, the conventional protective wafer substrate is replaced with the film layer, so that an effective packaging of a sealing cavity of the device may be achieved through a simple film lamination (corresponding to the film layer of the present disclosure) in the packaging of the radio frequency filter, a preparation process is significantly shortened, a production efficiency is improved, and a process flow is simplified; meanwhile, a use of the gold material is avoided, which significantly reduces a cost of the device, and improves a device competitiveness; more importantly, an unexpected technical effect is achieved: a processing period of the packaged product is shortened by more than half, which is a milestone development in a history of the radio frequency filter device research and development.

In order to better describe a structure of the radio frequency filter, the structure of the radio frequency filter of the present disclosure will be described in detail below with reference to FIG. 1A to FIG. 1C, and FIG. 2A to FIG. 2B. Here, those skilled in the art should understand that relevant technical details mentioned in "DETAILED DESCRIPTION OF EMBODIMENTS" are not intended to limit a protection scope of the present disclosure.

Figure 2A:
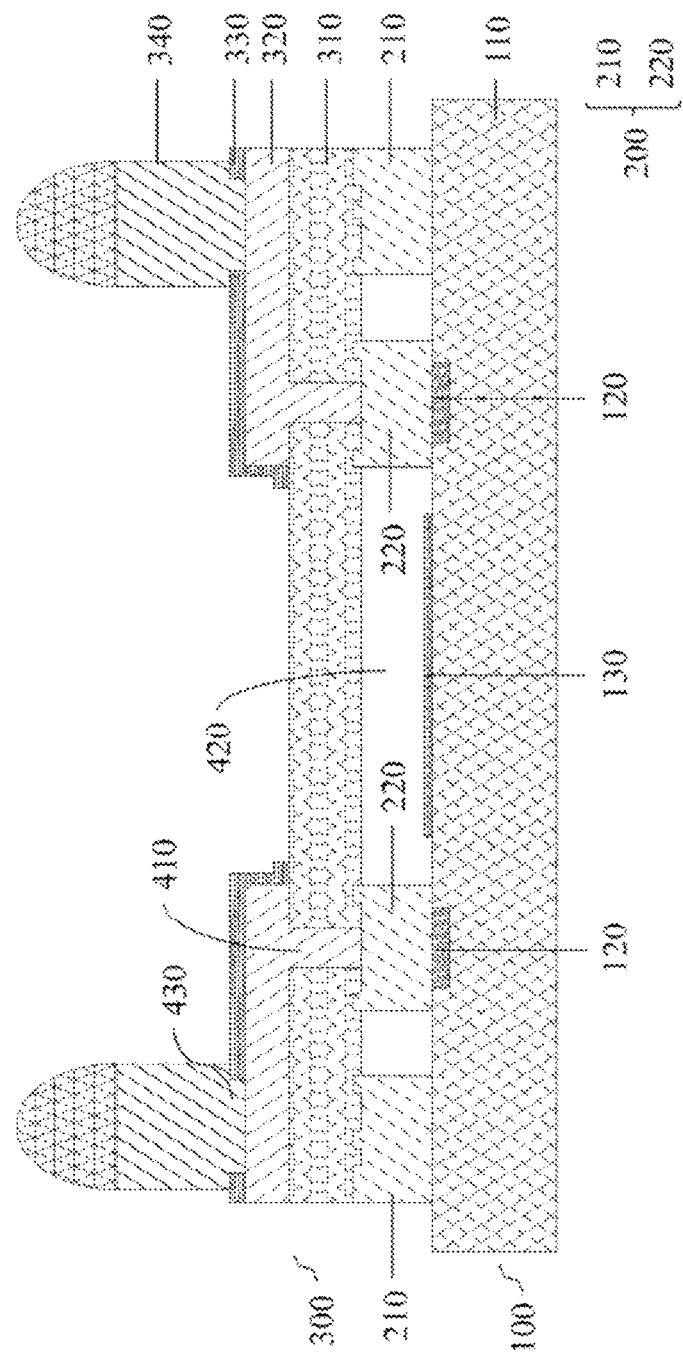
FIG. 2A is a cross-sectional diagram of a structure of the radio frequency filter corresponding to FIG. 1C having a back electrode taken along a tangent line B-B' according to an embodiment of the present disclosure.
Figure 2B:
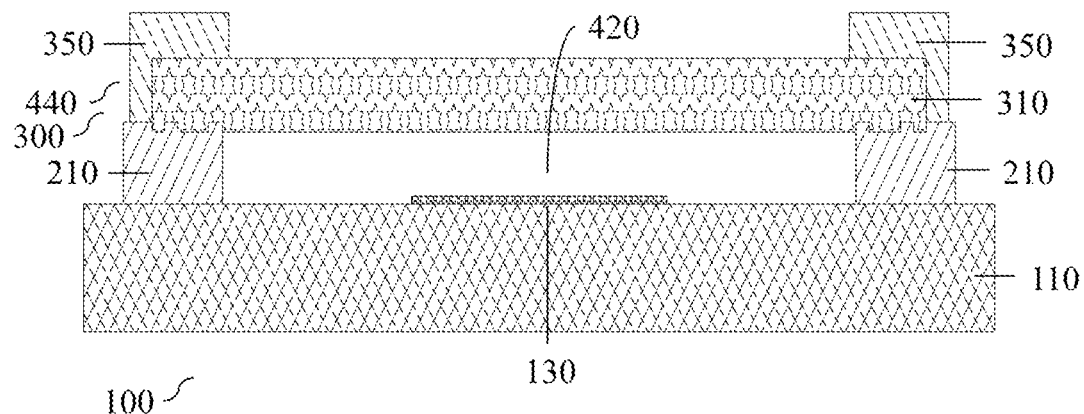
FIG. 2B is a cross-sectional diagram of a structure of the radio frequency filter corresponding to corresponding to FIG. 1C taken along a tangent line A-A' according to an embodiment of the present disclosure.

According to the embodiments of the present disclosure, as shown in FIG. 1A, and FIG. 2A to FIG. 2B, the supporting electrode 200 includes: a first supporting electrode 210, a first seed layer, a plurality of second supporting electrodes 220, and a plurality of second seed layers. The first supporting electrode 210 is protruded on an edge of the front surface of the substrate 110 with respect to the substrate 110, while the first supporting electrode is of an annular closed structure around the edge of the front surface of the substrate 110. The first supporting electrode 210 is used to support an edge of a device structure of the thin film structure 300. The first supporting electrode 210 may be formed of copper, a copper-like material, a copper-like alloy material, or the like, so as to reduce a material cost.

According to the embodiments of the present disclosure, as shown in FIG. 1A, and FIG. 2A to FIG. 2B, the first seed layer is provided between the first supporting electrode 210 and the substrate 110; the first seed layer is used as a transition layer between the first supporting electrode 210 and the substrate 110 to help increase a metal interlayer adhesion between a lower surface of the first supporting electrode 210 and the front surface of the substrate 110, so as to improve a diffusion capability of metal atoms on an interface contact.

According to the embodiments of the present disclosure, as shown in FIG. 1A, and FIG. 2A to FIG. 2B, each second supporting electrode 220 of the plurality of second supporting electrodes 220 is protruded outwardly on a middle portion of the front surface of the substrate 110 in a certain distribution, while the plurality of second supporting electrodes 220 are surrounded in the middle portion of the front surface of the substrate 110 by the first supporting electrode 210. The certain distribution may be a uniform distribution in a space surrounded by the first supporting electrode 210 on the front surface of the substrate 110, so as to effectively support a film layer 310 and improve a strength of a structure of the device. The second supporting electrode 220 is used to support a middle portion of the device structure of the thin film structure 300, and the second supporting electrode 220 may be formed of copper, a copper-like material, a copper-like alloy material, or the like, so as to reduce the material cost.

According to the embodiments of the present disclosure, as shown in FIG. 1A, and FIG. 2A to FIG. 2B, each second seed layer of the plurality of second seed layers is correspondingly provided between each second supporting electrode 220 of the plurality of second supporting electrodes 220 and the substrate 110. The second seed layer is used as a transition layer between the second supporting electrode 220 and the substrate 110 to help increase a metal interlayer adhesion between a lower surface of the second supporting electrode 220 and the front surface of the substrate 110, so as to improve a diffusion capability of metal atoms on an interface contact.

According to the embodiments of the present disclosure, a material of the first seed layer and each second seed layer of the plurality of second seed layers is titanium, tungsten, gold, copper, or a combination thereof, such as a titanium tungsten plus copper alloy, a titanium tungsten plus gold alloy, or the like.

According the embodiments of the present disclosure, as shown in FIG. 1A, and FIG. 2A to FIG. 2B, the radio frequency filter further includes: a protective cavity 420. The protective cavity 420 is the protective space described above, and is used to provide the protective space for the resonant structure provided on the substrate 110, while may also be used to provide the resonance space for the resonant structure.

According to the embodiments of the present disclosure, as shown in FIG. 1A, and FIG. 2A to FIG. 2B, the protective cavity 420 is a cavity space between the first supporting electrode 210, the plurality of second supporting electrodes 220, and the front surface of the substrate 110. A shape of the protective cavity 420 may be correspondingly configured according to a matching of the first supporting electrode 210 and the plurality of second supporting electrodes 220, which is not limited in the present disclosure. In addition, a main space of the protective cavity 420 (which may be understood as a space corresponding to the resonant structure) is required to be slightly larger than a size of the resonant structure corresponding to the protective cavity 420.

According to the embodiments of the present disclosure, as shown in FIG. 1A, and FIG. 2A to FIG. 2B, a distance between the front surface of the substrate 110 and the end surface of the top end of the first supporting electrode 210 is j1; a distance between the front surface of the substrate 110 and the end surface of the top end of each second supporting electrode 220 of the plurality of second supporting electrodes 220 is j2; $10 \ \mu m \leqslant j1 \leqslant 40 \ \mu m$; $10 \ \mu m \leqslant j2 \leqslant 40 \ \mu m$; $\Delta j = |j1-j2|$, and $\Delta j \leqslant 10 \ \mu m$. The distance j1 may be understood as a height of the first supporting electrode 210, and the distance j2 may be understood as a height of the second supporting electrode 220, which together determine a depth of the protective cavity 420 with respect to the device structure. According to the embodiments of the present disclosure, in an ideal state, the height j1 of the first supporting electrode 210 and the height j2 of the second supporting electrode 220 should be equal, i.e., $\Delta j=0$. Due to differences in the preparation processes (e.g., electroplating processes), formation positions (middle or edge) of the first supporting electrode 210 and the second supporting electrode 220 of the supporting electrode 200, the larger an overall height of the supporting electrode 200, the larger $\Delta j$. The design of $\Delta j \leqslant 10 \ \mu m$ is beneficial for the supporting electrode 200 to better support the film layer 310 after the film layer 310 of the thin film structure 300 is laminated, so as to prevent a structural deformation of the film layer 310 and enable the structure to be flatter.

According to the embodiments of the present disclosure, as shown in FIG. 1A, and FIG. 2A, the substrate 110 includes: a resonant structure and a plurality of lower electrode layers 120; the resonant structure is provided on the front surface of the substrate 110 corresponding to the protective cavity 420 for generating a resonance effect of the device.

According to the embodiments of the present disclosure, as shown in FIG. 1A, and FIG. 2A, each lower electrode layer 120 of the plurality of lower electrode layers 120 corresponds to the lower surface of each second supporting electrode 220 of the plurality of second supporting electrodes 220, and is inwardly concaved with respect to the front surface of the substrate 110; a material of the lower electrode layer 120 is copper, gold, molybdenum, aluminum, or a combination thereof. The resonant structure on the substrate 110 may be electrically connected to the second supporting electrode 220 through the lower electrode layer 120, and the second supporting electrode 220 may also be used to be electrical connected with the lower electrode layer 120.

According to the embodiments of the present disclosure, as shown in FIG. 1A, and FIG. 2A to FIG. 2B, the resonant structure includes at least: a piezoelectric layer 130 provided on the front surface of the substrate 110 corresponding to the protective cavity 420, and is used to perform a certain resonance function to help achieve the resonance effect. Meanwhile, according to the embodiments of the present disclosure, the resonant structure may further include a resonant cavity. The resonant cavity may be an inwardly concaved space located below the piezoelectric layer and is inwardly concaved with respect to the front surface of the substrate 110. The piezoelectric layer may be further used to close the resonant cavity at the same time.

According to the embodiments of the present disclosure, as shown in FIG. 1A to FIG. 2B, the substrate 110 further includes: a plurality of spacing layers; each spacing layer of the plurality of spacing layers corresponds to the lower surface of each lower electrode layer 120 of the plurality of lower electrode layers 120, and is provided between each lower electrode layer 120 of the plurality of lower electrode layers 120 and the substrate 110. The spacing layer is used as a transition layer between the lower electrode layer 120 and the substrate 110 to increase a metal interlayer adhesion between an outer surface of the lower electrode layer 120 and the substrate 110, so as to improve a diffusion capability of metal atoms on an interface contact. According to the embodiments of the present disclosure, a material of the spacing layer is titanium, tungsten, nickel, chromium, or a combination thereof.

Figure 1B:
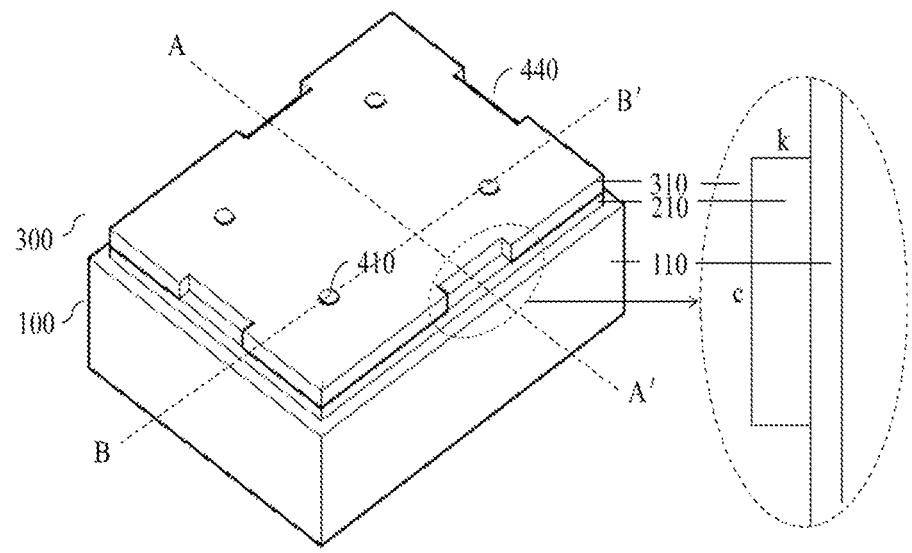
FIG. 1B is an external perspective diagram of the radio frequency filter corresponding to FIG. 1A covered with a film layer according to an embodiment of the present disclosure.
Figure 1C:
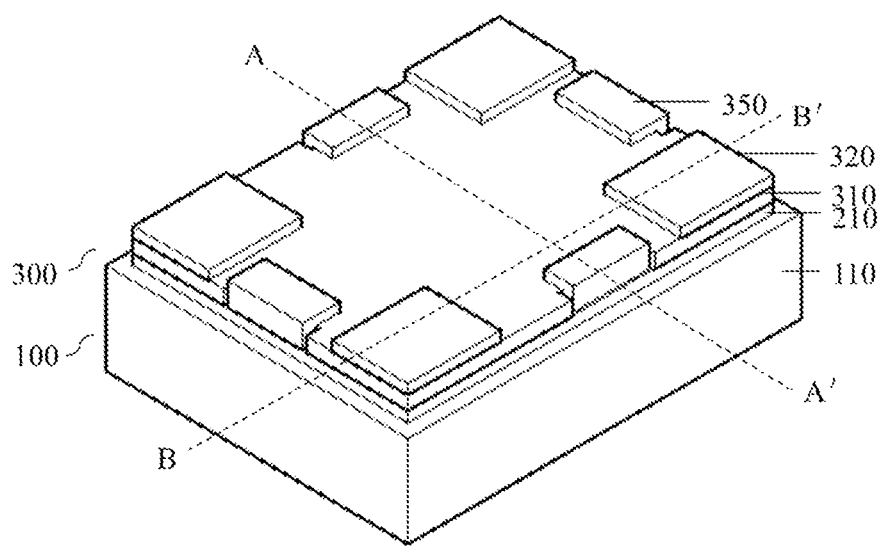
FIG. 1C is an external perspective diagram of the radio frequency filter corresponding to FIG. 1B having an anchoring portion and a leading electrode according to an embodiment of the present disclosure.

According to the embodiments of the present disclosure, as shown in FIG. 1B to FIG. 1C, and FIG. 2A, the thin film structure includes: a film layer 310, a plurality of through holes 410, a plurality of leading electrodes 320, and a plurality of back electrodes 340. The film layer 310 is provided on the substrate 110 with the supporting electrode 200 formed between the film layer and the substrate, and the end surface of the top end of the supporting electrode 200 is in sealing contact with a front surface of the film layer 310. A thickness of the film layer is m, and 10 µm ≤ m ≤ 60 µm. The film layer 310 is a main body structure of the film structure 300, the film layer may be a dry film type thin film, and a curing process may be performed on the film layer so as to replace a conventional bonding solution with a high temperature and a high pressure, and achieve a device sealing. The thickness of the film layer 310 may be varied before and after the curing. Specifically, the thickness m of the cured film layer 310 may be 20% to 50% of the thickness m' prior to the curing. In additional, the film layer 310 may be all or a part of a wafer-level lamination film structure.

Therefore, in the present disclosure, the film layer 310 is used to creatively replace the conventional wafer substrate as the protective layer, while achieving the device packaging process between the film layer 310 and the substrate 110, which is lower in the cost and easier in the device processing, and is an initiative in the art. The technical bias of "using the thin film structure as the protective layer" in the art is overcome structurally, the conventional protective wafer substrate is replaced with the film layer 300, so that an effective packaging of the sealing cavity of the device may be achieved through a simple film lamination in the packaging of the radio frequency filter, the preparation process is significantly shortened, the production efficiency is improved, and the process flow is simplified; meanwhile, the use of the gold material is avoided, which significantly reduces the cost of the device, and improves the device competitiveness; more importantly, an unexpected technical effect is achieved: a processing period of the packaged product is shortened by more than half, and process flows and corresponding apparatuses of deep silicon etching, deep hole sputtering, high temperature and high pressure bonding, etc. are no longer required, which significantly improves the preparation efficiency, saves the preparation time and the preparation cost, and significantly reduces the cost of packaging and production, which may be regarded as a milestone development in the history of the radio frequency filter device research and development.

According to the embodiments of the present disclosure, as shown in FIG. 1B to FIG. 1C, and FIG. 2A, each through hole 410 of the plurality of through holes 410 is arranged corresponding to a middle position of the end surface of the top end of each second supporting electrode 220 of the plurality of second supporting electrodes 220, and penetrates through the film layer 310; the through hole 410 is used to provide a certain filling space and a fixed position for the leading electrode 320, which is beneficial to a more regular and controllable distribution of the leading electrode 320 on a back surface of the film layer 310.

According to the embodiments of the present disclosure, as shown in FIG. 1B to FIG. 1C, and FIG. 2A, each leading electrode 320 of the plurality of leading electrodes 320 is correspondingly filled corresponding to each through hole 410 of the plurality of through holes 410. A lower end of each leading electrode 320 of the plurality of leading electrodes 320 is in contact with the end surface of the top end of each second supporting electrode 220 of the plurality of second supporting electrodes 220. An upper end of each leading electrode 320 of the plurality of leading electrodes 320 is laid on the back surface of the film layer 310. An inner surface of the upper end of each leading electrode 320 of the plurality of leading electrodes 320 is in contact with the back surface of the film layer 310. A thickness of the upper end of each leading electrode 320 of the plurality of leading electrodes 320 on the back surface of the film layer is y, and 5 µm ≤ y ≤ 40 µm. The lower end portion of the leading electrode 320 is filled in the through hole 410, and a lower surface of the lower end portion of the leading electrode 320 is in sealing contact with the end surface of the top end of the second supporting electrode 220. The leading electrode 320 is used to connect the lower electrode layer of the device with the outside in the case where the lower surface of the second supporting electrode 220 is in electrical contact with the lower electrode layer 120 on the substrate 110.

According to the embodiments of the present disclosure, as shown in FIG. 1B to FIG. 1C, and FIG. 2A, the upper end portion of the leading electrode 320 is laid on the back surface of the film layer 310, and is preferably laid on a back surface area of the corresponding film layer 310 between the second supporting electrode 220 and the first supporting electrode 210. An area of the back surface of the film layer 310 is s1, a distribution area of the upper end of each leading electrode 320 of the plurality of leading electrodes 320 on the back surface of the film layer 310 is s2, the number of the plurality of leading electrodes distributed on the back surface of the film layer 310 is n, Δs=(n×s2)/s1, and Δs ≥ 0.2. The closer the value of Δs to 1, the larger the covering area of the upper end portion of the leading electrodes 320 on the back surface of the film layer 310. Thus, the leading electrode 320 may also be used to improve a structural strength of the film layer 310 while increase an overall heat dissipation efficiency of the device. A material of the leading electrode 320 may be copper or other metals. In the device structure of the present disclosure, since a control of the distribution area of the leading electrodes on the back surface of the film layer may be achieved, and the heat dissipation efficiency of the device may be further improved.

According to the embodiments of the present disclosure, as shown in FIG. 1B to FIG. 1C, and FIG. 2A, each back electrode 340 of the plurality of back electrodes 340 is provided corresponding to each leading electrode 320 of the plurality of leading electrodes 320 on an outer surface of the upper end of each leading electrode 320 of the plurality of leading electrodes 320, and is correspondingly provided right above the first supporting electrode 210. The first supporting electrode 210 may be used to simultaneously support the film layer 310 and the back electrode 340 located on the back surface of the film layer 310. A height of the back electrode is b, and 30 µm ≤ b ≤ 150 µm. A lower surface of the back electrode 340 is connected to the outer surface of the leading electrode 320. The back electrode 340 may be used to achieve an electrical connection between the device structure and the outside.

According to the embodiments of the present disclosure, as shown in FIG. 2A, the thin film structure 300 further includes: a plurality of passivation layers 330 and a plurality of passivation holes 430; each passivation layer 330 of the plurality of passivation layers 330 corresponds to each leading electrode 320 of the plurality of leading electrodes 320, and is overlaid on the outer surface of the upper end of each leading electrode 320 of the plurality of leading electrodes 320. The passivation layer 330 may be used to protect the leading electrode 320 (e.g., from being damaged in subsequent processes) to increase a reliability of the device. The passivation layer 330 is required to be able to completely cover the leading electrode 320. A material of the passivation layer 330 may be a dielectric material or a colloidal material.

According to the embodiments of the present disclosure, as shown in FIG. 2A, each passivation hole 430 of the plurality of passivation holes 430 corresponds to each back electrode 340 of the plurality of back electrodes, and is opened in each passivation layer 330 of the plurality of passivation layers 330. The passivation hole 430 is used to open the passivation layer 330 and provide a space for the back electrode 340 to be formed on the outer surface of the upper end portion of the leading electrode 320, so that the back electrode 340 may be electrically connected to the leading electrode 320.

According to the embodiments of the present disclosure, as shown in FIG. 1B to FIG. 1C, and FIG. 2B, the thin film structure 300 further includes: a plurality of anchoring openings 440 and a plurality of anchoring portions 350; the plurality of anchoring openings 440 are correspondingly disposed above the first supporting electrode 210 along an edge of the film layer 310, a projection size of the anchoring opening 440 on the back surface of the film layer 310 includes a length c and a width k, $c \geq 40$ µm, and $k \geq 10$ µm, as specifically shown in FIG. 1B. The larger the values of c and k, the larger the contact area between the anchoring portion 350 and the film layer 310, which is determined by the anchoring opening 440, so that the anchoring opening 440 is used to provide an anchoring location for the anchoring portion 350 to facilitate to better seal the film layer 310 on the substrate 110. A bottom surface of the anchoring opening 440 is the upper surface of the first supporting electrode 210, i.e., the thickness of the film layer 310 is a height of the anchoring opening 440. The values of c and k may be set according to the size of the first supporting electrode 210.

According to the embodiments of the present disclosure, as shown in FIG. 1B to FIG. 1C, and FIG. 2B, each anchoring portion 350 of the plurality of anchoring portions 350 is correspondingly provided in each anchoring opening 440 of the plurality of anchoring openings 440, a thickness of the anchoring portion 350 is d, and 5 µm ≤ d ≤ 40 µm. A material of the anchoring portion 350 may be a metal, so as to improve the strength of the film layer 310, while enhancing the sealing between the film layer 310 and the first supporting electrode 210. After the curing process, the film layer may achieve a certain strength and corrosion resistance through the anchoring portion 350, thereby further enhancing a reliability and stability of the device, while increasing the strength of the device, and prolonging a lifetime of the device.

According to the embodiments of the present disclosure, as shown in FIG. 1B to FIG. 1C, and FIG. 2B, each anchoring portion 350 of the plurality of anchoring portions 350 may have an L-shaped design, including: an anchor end at an upper end of the anchoring portion 350 and a fixed end at a lower end of the anchoring portion 350. The L-shaped design is more beneficial for the anchoring portion 350 to achieve a sealing effect and strength enhancement benefit brought by the anchoring. The anchor end and the fixed end are connected to each other and integrally designed to constitute the anchoring portion 350. According to the embodiments of the present disclosure, the anchor end is correspondingly arranged in the anchoring opening 440; a thickness d of the anchor end may be a thickness of the anchor end of the anchoring portion 350 anchored to the edge of the back surface of the film layer 310, and the anchor end is used to provide a top-down anchoring force to the back surface of the film layer 310 to facilitate an anchoring effect. According to the embodiments of the present disclosure, the fixed end is correspondingly arranged on the back surface of the film layer, and a thickness d of the fixed end may be a width of the fixed end of the anchoring portion 350 anchored to the side surface of the film layer 310 and located on the upper surface of the first supporting electrode 210, which corresponds to the k value described above. The fixed end is used to provide a bottom-up, outside-in anchoring force on the side surface of the film layer 310 and the first supporting electrode layer 210 to help achieve the anchoring effect.

According to the embodiments of the present disclosure, as shown in FIG. 2A, the supporting electrode 200 further includes a sealing structure used to form a sealing contact between the front surface of the film layer 310 and the sealing structure when the film layer 310 is laminated and before the curing process is performed (at this time, the front surface of the film layer 310 has a certain adhesive force to facilitate to achieve a sealing in cooperation with the sealing structure). After the curing process, the sealing of the device structure will be completed by the front surface of the film layer 310 through the sealing structure.

According to the embodiments of the present disclosure, as shown in FIG. 2A, the sealing structure includes: a first sealing structure and a plurality of second sealing structures; the first sealing structure is provided on the end surface of the top end of the first supporting electrode 210, and is used for the sealing between the first supporting electrode 210 and the front surface of the film layer 310, so as to achieve an external packaging of the device. Each second sealing structure of the plurality of second sealing structures corresponds to each second supporting electrode of the plurality of second supporting electrodes, each second sealing structure is provided on the end surface of the top end of each second supporting electrode of the plurality of second supporting electrodes, and is used for the sealing between the plurality of second supporting electrodes 220 and the front surface of the film layer 310, so as to achieve an internal packaging of the device.

According to the embodiments of the present disclosure, as shown in FIG. 2A, the first sealing structure and each second sealing structure of the plurality of second sealing structures include a plurality of correspondingly disposed convex or concave portions, a height of the convex portion is t, a depth of the concave portion is a, $t \geq 1$ µm, and $a \geq 1$ µm. The design of the convex portion or the concave portion will be more beneficial for a fixation (e.g., preventing a slipping, a dislocation, etc.), a connection, and a sealing between the first sealing structure, the second sealing structure and the front surface of the film layer 310 during the lamination-curing process of the film layer 310.

Figure 3:
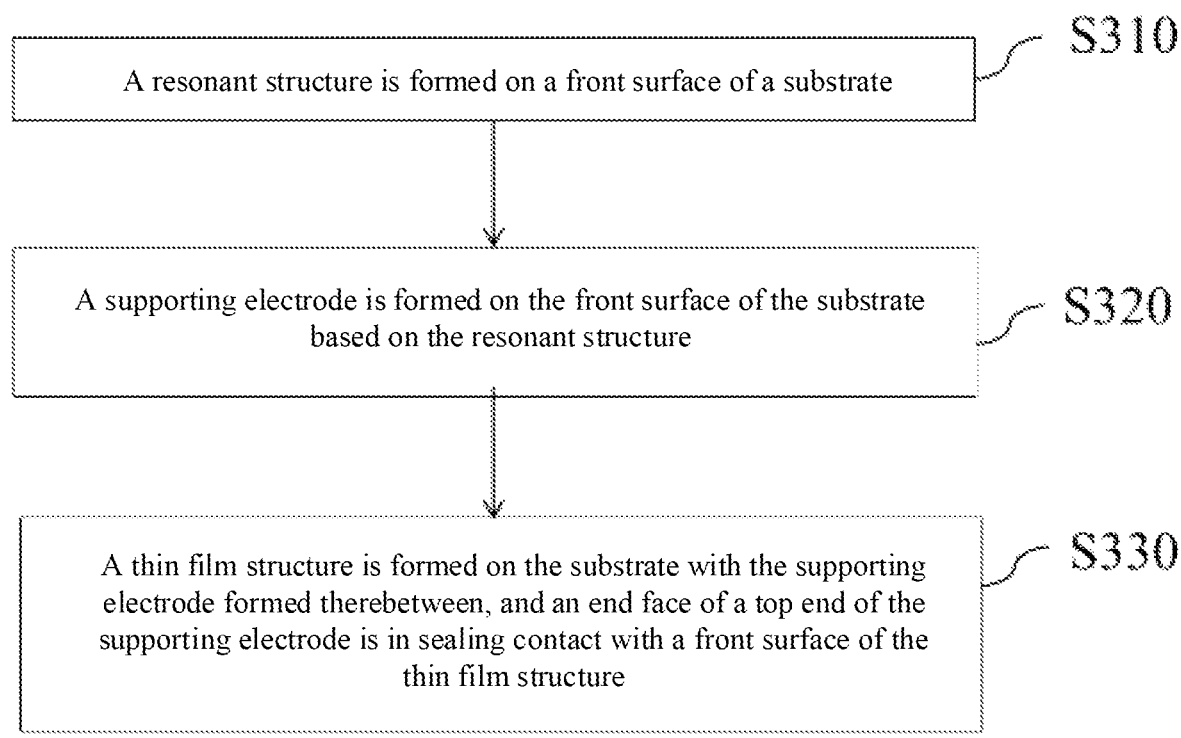
FIG. 3 is a schematic diagram of a preparation process flow of the radio frequency filter corresponding to FIG. 2A and FIG. 2B according to an embodiment of the present disclosure.

Another aspect of the present disclosure provides a method of preparing the radio frequency filter described above. As shown in FIG. 3, the method includes:

S310: a resonant structure is formed on a front surface of a substrate 110. Specifically, a piezoelectric layer 130, a lower electrode layer 120, etc. of the resonant structure may be formed on the front surface of the substrate 110.

S320: a supporting electrode 200 is formed on the front surface of the substrate 110 based on the resonant structure. Specifically, a protective cavity for the resonant structure based on the supporting electrode 200 may be formed on the front surface of the substrate 110. A preparation of the supporting electrode 200 may be achieved by electroplating on the front surface of the substrate 110 according to a mask pattern, so as to enhance a contact strength between the supporting electrode 200 and the front surface of the substrate 110.

S330: a thin film structure 300 is formed on the substrate 110 with the supporting electrode 200 formed between the film structure and the substrate, and an end surface of a top end of the supporting electrode 200 is in sealing contact with a front surface of the thin film structure 300. Specifically, a film layer 310 of the film structure 300 may be fixedly sealed on the end surface of the top end of the supporting electrode 200 through a lamination-curing process, so as to achieve a packaging of the device.

In order to facilitate an understanding of those skilled in the art, a description of a following specific embodiment focuses on explaining a preparation method and process to reduce repetition, for a specific structural description, reference may be made to the specific embodiments described above and will not be repeated here.

Figure 4:
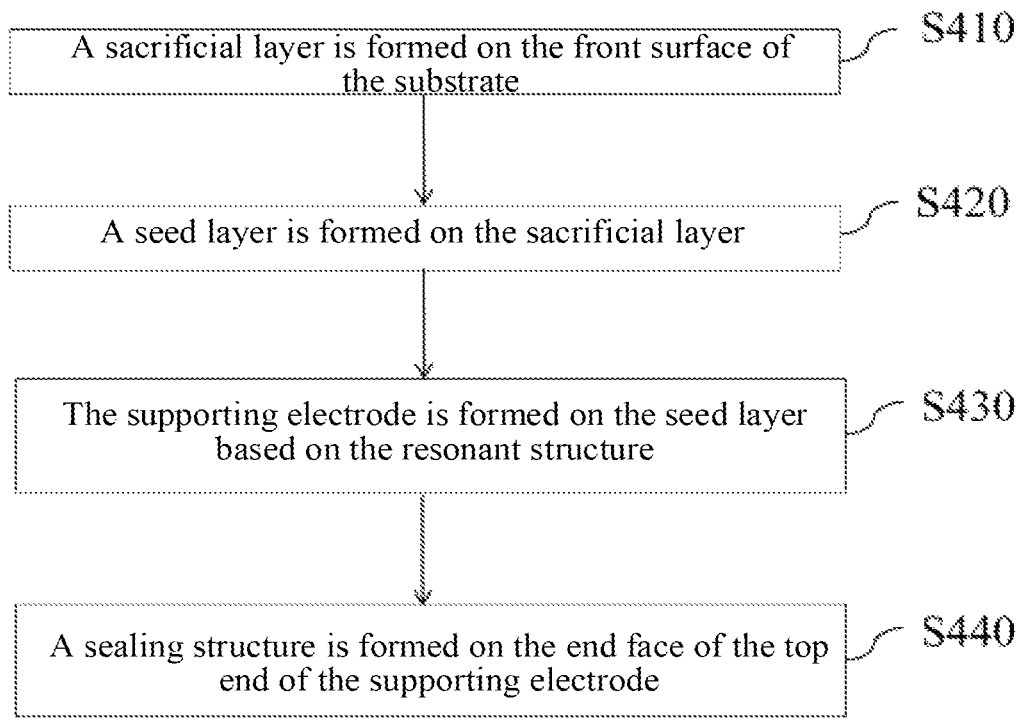
FIG. 4 is a schematic diagram of a preparation process flow of a radio frequency filter according to an embodiment of the present disclosure.

According to the embodiments of the present disclosure, as shown in FIG. 4, the forming a supporting electrode 200 on the front surface of the substrate 110 based on the resonant structure includes:

S410: a sacrificial layer 140 is formed on the front surface of the substrate 110.

Figure 5A:
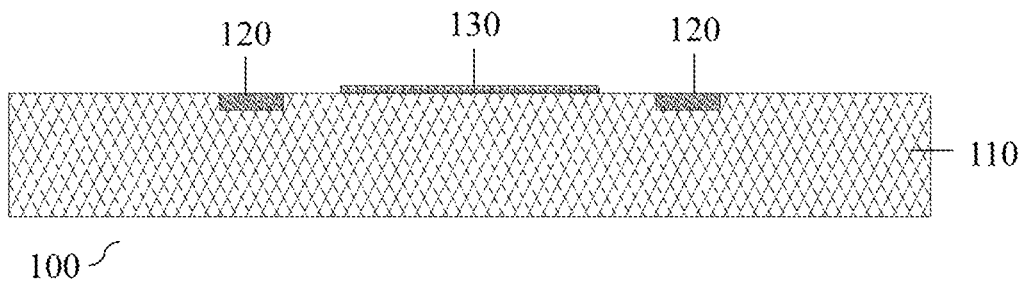
FIG. 5A is a structural diagram of a radio frequency filter in a preparation process flow stage according to an embodiment of the present disclosure.

According to the embodiments of the present disclosure, the resonant structure and the lower electrode layer 120 are formed on the substrate 110, and the resonant structure includes at least the piezoelectric layer 130 formed on the front surface of the substrate 110 to complete a preparation of the substrate 110. In case of necessity, a resonant cavity enclosed by the piezoelectric layer 130 is required to be prepared under the piezoelectric layer 130, such as in a preparation of a bulk acoustic wave radio frequency filter (corresponding to a surface acoustic wave radio frequency filter having only the piezoelectric layer 130), as shown in FIG. 5A.

Figure 5B:
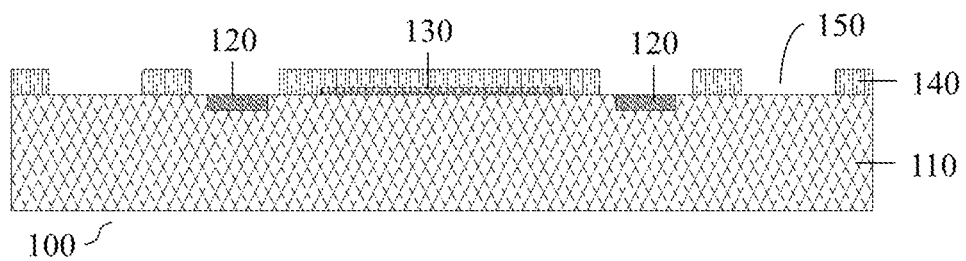
FIG. 5B is another structural diagram of a radio frequency filter in a preparation process flow stage according to an embodiment of the present disclosure.

According to the embodiments of the present disclosure, a layer of process-protective sacrificial layer 140 with a thickness of about 2000 Å to 1 µm is deposited on the front surface of the substrate 110 on which the resonant structure and the lower electrode layer 120 have been prepared. A material of the sacrificial layer 140 may be silicon oxide. The sacrificial layer may protect the substrate 110 from being damaged in subsequent process steps. Then, the resonant structure on the front surface of the substrate 110 and the lower electrode layer 120 are used as a mask pattern to perform etching (e.g., photolithography) or other processes on the sacrificial layer 140, so that the supporting electrode 200 forms a supporting electrode opening 150 with respect to the front surface of the substrate 110, as shown in FIG. 5B.

According to the embodiments of the present disclosure, the sacrificial layer 140 is required to be removed in the subsequent process. When the radio frequency filter is the bulk acoustic wave filter, a removal of the sacrificial layer above the resonant cavity is required to be performed after the supporting electrode 200 is prepared, so as to avoid affecting the removal of the sacrificial layer of the resonant cavity.

S420: a seed layer is formed on the sacrificial layer 140.

According to the embodiments of the present disclosure, the seed layer may be formed on the front surface of the substrate 110 by a physical vapor deposition method. The seed layer is a metal layer, and a material of the seed layer may be titanium, tungsten, gold, copper, or a combination thereof, such as a titanium-tungsten plus copper alloy material, or a titanium-tungsten plus alloy material. The seed layer may facilitate to increase a metal interlayer adhesion between a lower surface of the supporting electrode 200 and the front surface of the substrate 110 so as to improve a diffusion capability of metal atoms on an interface contact.

S430: the supporting electrode 200 is formed on the seed layer based on the resonant structure.

Figure 5C:
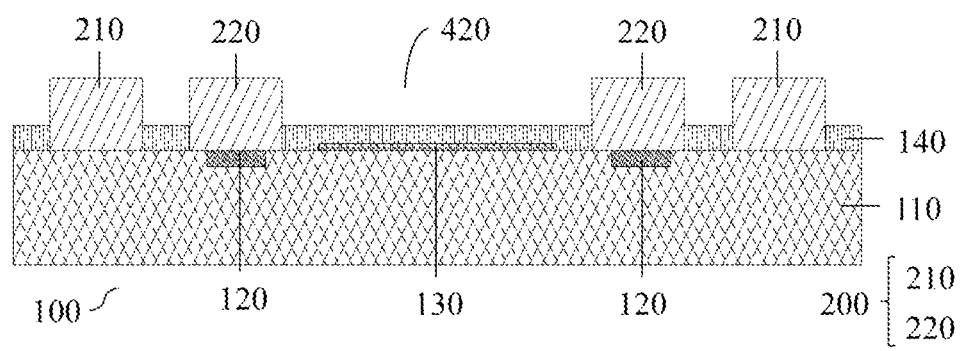
FIG. 5C is another structural diagram of a radio frequency filter in a preparation process flow stage according to an embodiment of the present disclosure.

According to the embodiments of the present disclosure, the supporting electrode 200 may be prepared through a process of photolithography plus electroplating. A material of the supporting electrode 200 may be copper, or a copper-like material, a copper-like alloy material, or the like. At this time, the seed layer formed in step S420 described above exposed on the front surface of the substrate 110 and located outside an area of the supporting electrode 200 may be selectively removed, while only the seed layer between the supporting electrode 200 and the front surface of the substrate 110, i.e., corresponding to the first seed layer and the second seed layer of the supporting electrode 200 described above, may be left, as shown in FIG. 5C.

In S440, a sealing structure is formed on the end surface of the top end of the supporting electrode 200.

Figure 5D:
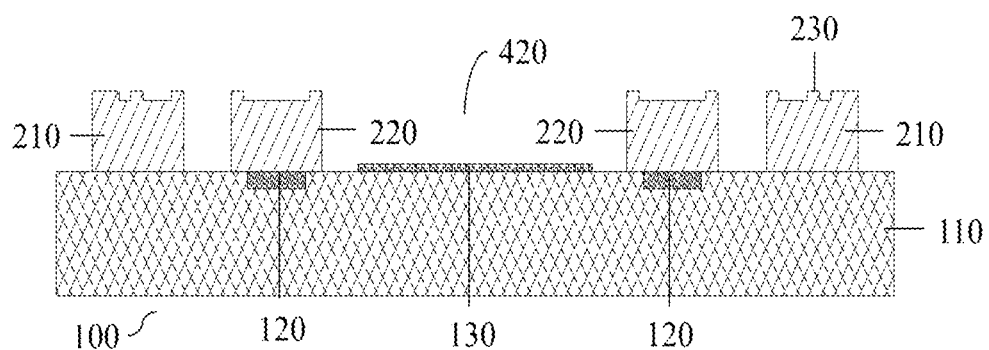
FIG. 5D is yet another structural diagram of a radio frequency filter in a preparation process flow stage according to an embodiment of the present disclosure.

According to the embodiments of the present disclosure, the sealing structure may be formed on an end surface of a top end of the supporting electrode 200 by a process of manufacturing a mask in photolithography and wet etching. The sealing structure may have a plurality of convex portions 230 or concave portions 230. The convex portion 230 or concave portion 230 presents a sealing pattern at a top viewing angle of the end surface of the top end of the supporting electrode 200; a protruded height of the convex portion 230 with respect to the end surface is controlled to be greater than 1 µm, or a recessed depth of the concave portion 230 with respect to the end surface is controlled to be greater than 1 µm, as shown in FIG. 5D.

It should be noted that if the seed layer formed in step S420 and exposed to the outside of the substrate 110 is not removed in step S430, it is necessary to remove the seed layer at this time. Specifically, the seed layer may be removed by a wet etching process. At this time, the first seed layer and the second seed layer located in the supporting electrode 200 may be correspondingly formed.

Referring to FIG. 1A to FIG. 2B, the supporting electrode 200 includes: the first supporting electrode 210 and the plurality of second supporting electrodes 220; the first supporting electrode 210 is protruded on the edge of the front surface of the substrate 110 with respect to the substrate 110, while the first supporting electrode 210 is of an annular closed structure surrounding the edge of the front surface of the substrate 110. Each second supporting electrode 220 of the plurality of second supporting electrodes 220 is protruded outwardly in the middle portion of the front surface of the substrate 110 with respect to the substrate 110 in the certain distribution, while the plurality of second supporting electrodes 220 are surrounded by the first supporting electrode 210 in the middle portion of the front surface of the substrate 110.

The sealing structure includes: the first sealing structure and the plurality of second sealing structures. The first sealing structure is arranged on the end surface of the top end of the first supporting electrode 210, and each second sealing structure of the plurality of second sealing structures corresponds to each second supporting electrode 220 of the plurality of second supporting electrodes 220, and is arranged on the end surface of the top end of each second supporting electrode 220 of the plurality of second supporting electrodes 220. The first sealing structure and each second sealing structure of the plurality of second sealing structures include the plurality of correspondingly provided convex portions 230 or concave portions 230.

Figure 6:
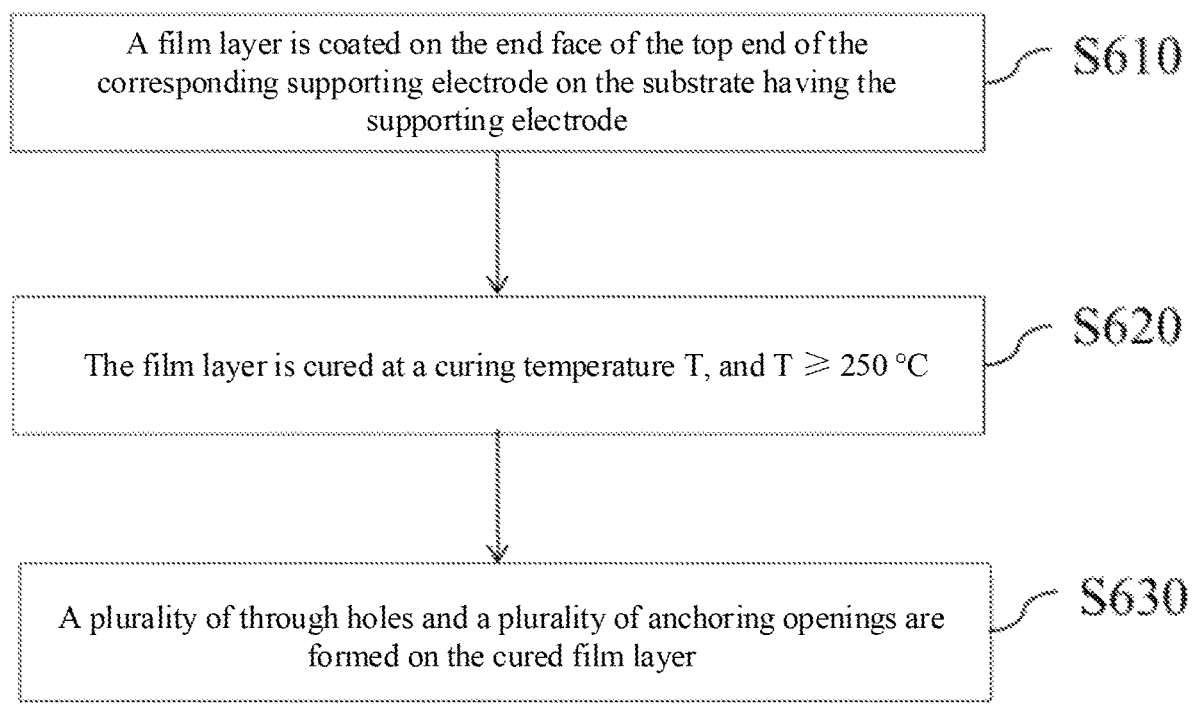
FIG. 6 is a schematic diagram of another preparation process flow of a radio frequency filter according to an embodiment of the present disclosure.

According to the embodiments of the present disclosure, as shown in FIG. 6, the forming a thin film structure 300 on the substrate 110 with the supporting electrode 200 formed between the film structure and the substrate includes:

S610: a film layer 310 is laminated on the end surface of the top end of the corresponding supporting electrode 200 on the substrate 110 having the supporting electrode 200.

Figure 7A:
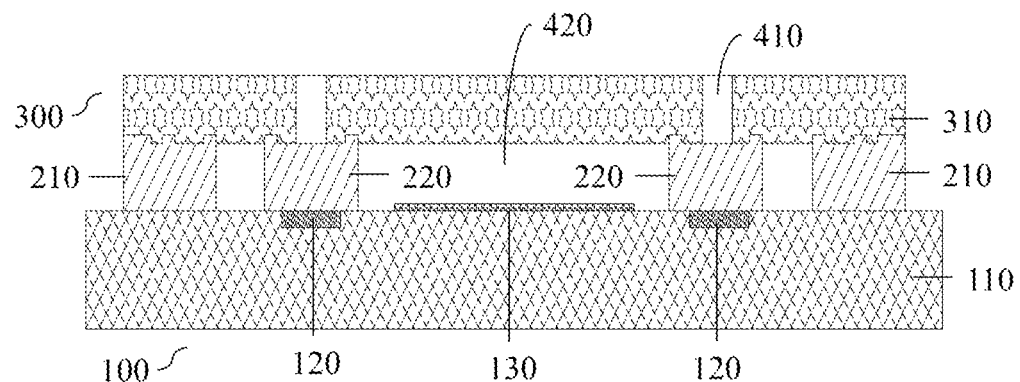
FIG. 7A is a structural diagram of a radio frequency filter in another preparation process flow stage according to an embodiment of the present disclosure.
Figure 7B:
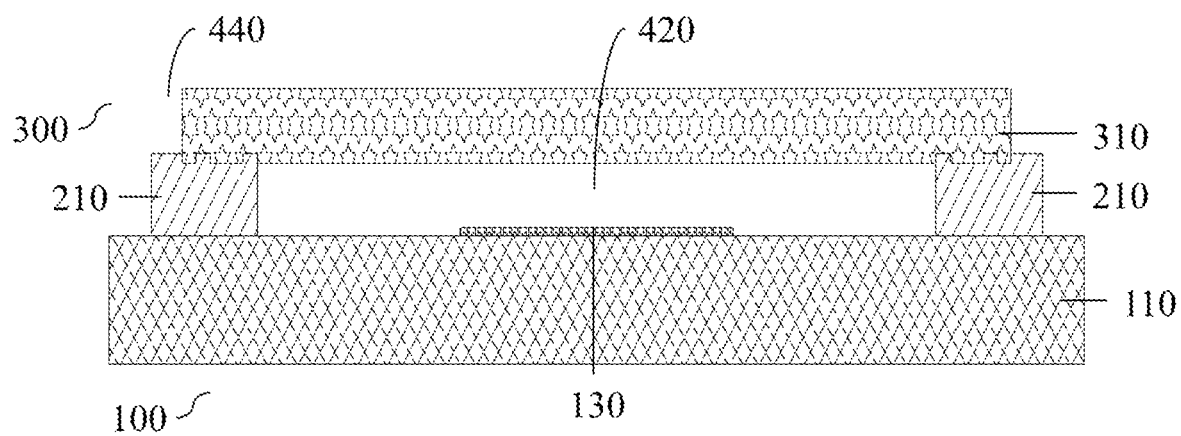
FIG. 7B is another structural diagram of the radio frequency filter corresponding to FIG. 1B in another preparation process flow stage taken along a tangent line A-A' according to an embodiment of the present disclosure.

According to the embodiments of the present disclosure, a protective sealing film, i.e., the film layer 310, may be laminated to an entire surface of the substrate 110 having the supporting electrode 200 through a wafer-level film lamination process; a protective cavity 420 of a resonant structure isolated from the outside is formed by a supporting of the supporting electrode 200. The film layer 310 may be a dry film. At this time, a sealing pattern on the sealing structure may serve for a fixation and an adhesion on the front surface of the film layer 310 to facilitate a subsequent curing and sealing of the film layer 310, as shown in FIG. 7A and FIG. 7B.

S620: the film layer is cured at a curing temperature T, and T ≥ 250° C.

According to the embodiments of the present disclosure, the final protective sealing film layer 310 is formed through a high temperature curing process, and the curing temperature is controlled to be above 250° C., thus an influence of a high temperature in subsequent processing steps on the film layer 310 may be compatible. A thickness of the cured film layer 310 may be 10 μm to 60 μm, as shown in FIG. 7A and FIG. 7B.

S630: a plurality of through holes 410 and a plurality of anchoring openings 440 are formed on the cured film layer 310.

According to the embodiments of the present disclosure, the plurality of through holes 410 for filling the leading electrode 320 and the plurality of anchoring openings 440 for correspondingly forming a plurality of anchoring portions may be formed above the supporting electrode 200 through a photolithography process. The plurality of through holes 410 may also be formed through other processes such as laser; and the anchoring openings 440 may also be prepared by a mechanical cutting or laser process, as shown in FIG. 7A and FIG. 7B.

Referring to FIG. 1A to FIG. 2B, each through hole 410 of the plurality of through holes 410 is arranged corresponding to the middle position of the end surface of the top end of each second supporting electrode 220 of the plurality of second supporting electrodes 220, and penetrates through the film layer 310. The plurality of anchoring openings 440 are arranged along the edge of the film layer 310 above the first supporting electrode 210.

Figure 8:
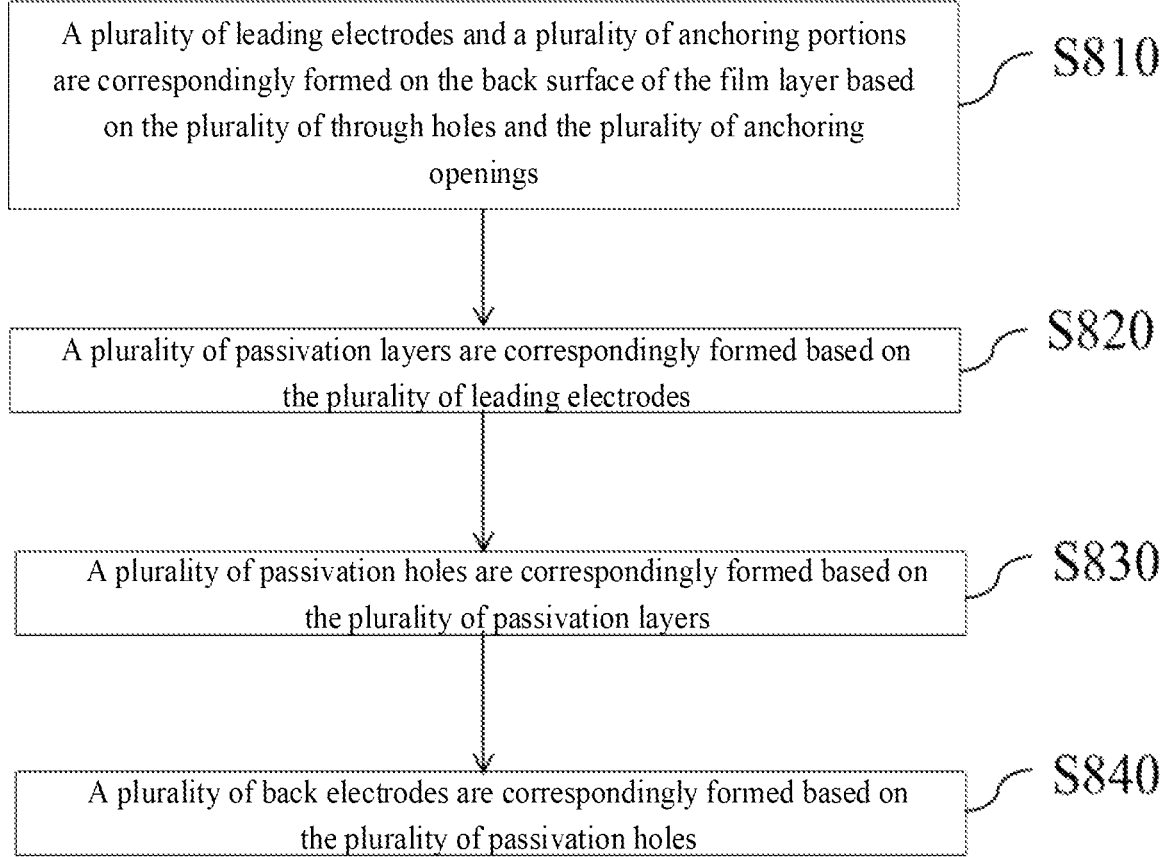
FIG. 8 is a schematic diagram of another preparation process flow of a radio frequency filter according to an embodiment of the present disclosure.

According to the embodiments of the present disclosure, as shown in FIG. 8, the forming a thin film structure 300 on the substrate 110 with the supporting electrode 200 formed between the film structure and the substrate further includes:

S810: a plurality of leading electrodes 320 and a plurality of anchoring portions 350 are correspondingly formed on the back surface of the film layer 310 based on the plurality of through holes 410 and the plurality of anchoring openings 440.

Figure 9A:
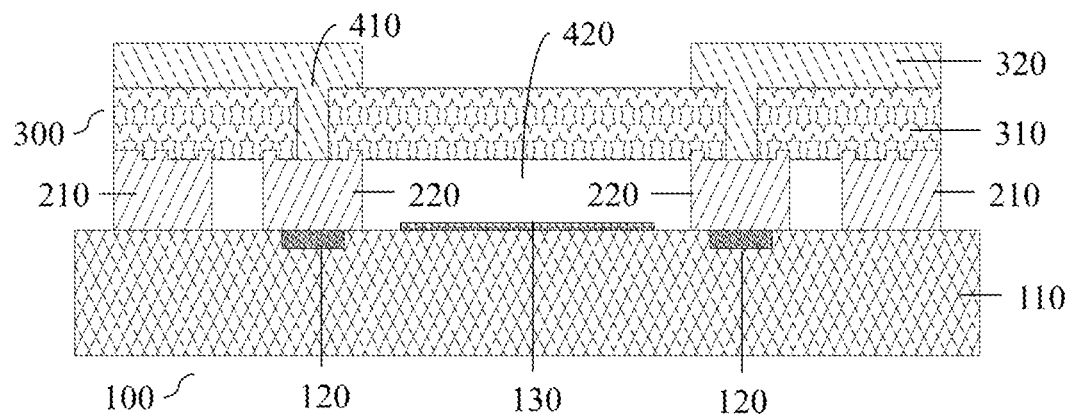
FIG. 9A is a structural diagram of another preparation process flow stage of a radio frequency filter according to an embodiment of the present disclosure.

According to the embodiments of the present disclosure, a seed layer may be formed by physical vapor deposition on the back surface of the film layer 310 of the thin film structure in which the plurality of through holes 410 and the plurality of anchoring openings 440 are formed, and the leading electrode 320 and the anchoring portion 350 may be prepared by using a photolithography and wiring (RDL) electroplating technique, a thickness of the leading electrode and a thickness of the anchoring portion may be controlled to be 5 μm to 40 μm, as shown in FIG. 9A and FIG. 2B. A contact width k of the anchoring portion 350 with the first supporting electrode 210 is ≥ 10 μm, and a length c of the anchoring portion is ≥ 40 μm. The anchoring portion 350 may be a colloidal material or a metal material. In order to improve a sealing performance of the protective sealing film, a distribution of the anchor portions 350 may be provided around the device along the first supporting electrode 210, and is not limited to anchoring only a certain local area of the film layer 310. In addition, the leading electrode 320 is not only used to be electrical interconnected (for example, flip interconnected or leading interconnected, etc.) with the outside, but may also be used to strengthen the strength of the film layer 310. The coverage area of the leading electrode 320 is enlarged as much as possible to achieve better heat dissipation effect.

S820: a plurality of passivation layers 330 are correspondingly formed based on the plurality of leading electrodes 320.

Figure 9B:
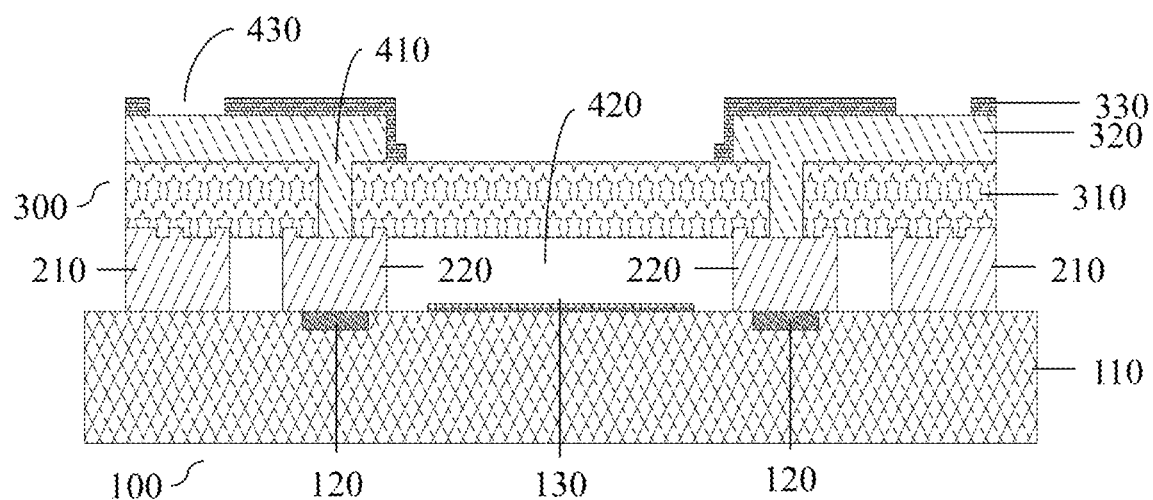
FIG. 9B is another structural diagram of another preparation process flow stage of a radio frequency filter according to an embodiment of the present disclosure.

According to the embodiments of the present disclosure, the passivation layer 330 may be prepared on a back surface of the leading electrode 320 by lamination or chemical vapor deposition process, which may protect the leading electrode 320, for example, preventing the leading electrode 320 from being damaged by the subsequent processing steps, as shown in FIG. 9B.

S830: a plurality of passivation holes 430 are correspondingly formed based on the plurality of passivation layers 330.

According to the embodiments of the present disclosure, a part of the passivation layer 330 formed on the outer surface of the leading electrode 320 at a location on the outer surface of the leading electrode 320 on the back surface of the film layer 310 may be etched through an etching process such as photolithography, so as to form the passivation hole 430 penetrating through the passivation layer 330 on the passivation layer 330, the passivation hole is used to contact the back electrode 340 formed in the subsequent steps with the leading electrode 320, ie, achieving an electrical connection between the back electrode and the leading electrode, as shown in FIG. 9B.

S840: a plurality of back electrodes 340 are correspondingly formed based on the plurality of passivation holes 430.

Figure 9C:
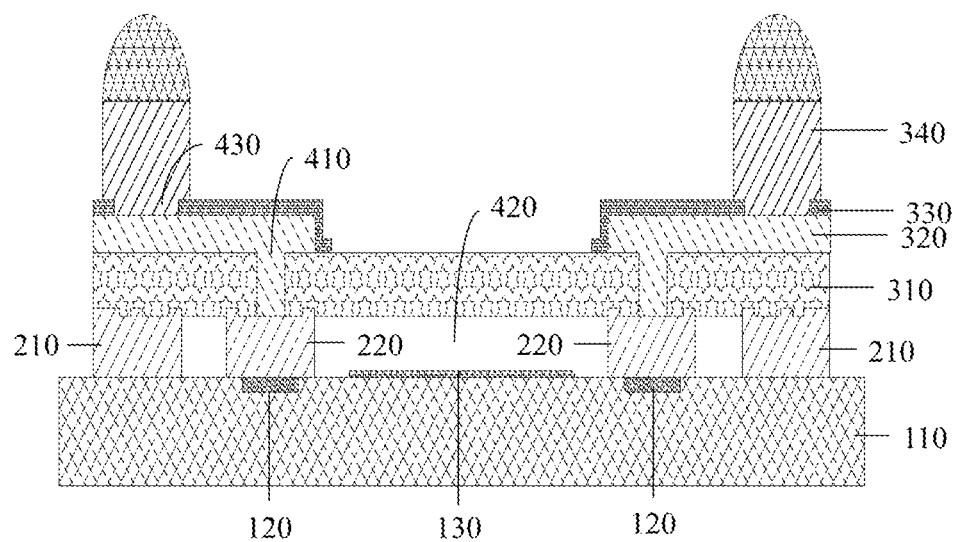
FIG. 9C is another structural diagram of another preparation process flow stage of a radio frequency filter according to an embodiment of the present disclosure.

According to the embodiments of the present disclosure, a flip electrode, i.e., the back electrode 340, contacting the outer surface of the leading electrode 320 may be formed at the location of the passivation hole 430 through an electroplating process, and a height of the back electrode 340 is controlled to be 30 μm to 150 μm. Specifically, a metal seed layer may be formed on the back surface of the thin film structure on which the passivation hole 430 is formed by physical vapor deposition, and the back electrode 340 may be formed on the passivation hole 430 by using processes of photolithography and electroplating, as shown in FIG. 9C.

Referring to FIG. 1A to FIG. 2B, each leading electrode 320 of the plurality of leading electrodes 320 is correspondingly filled in each through hole 410 of the plurality of through holes 410; the lower end of each leading electrode 320 of the plurality of leading electrodes 320 is in contact with the end surface of the top end of each second supporting electrode 220 of the plurality of second supporting electrodes 220; the upper end of each leading electrode 320 of the plurality of leading electrodes 320 is laid on the back surface of the film layer 310; the inner surface of the upper end of each leading electrode 320 of the plurality of leading electrodes 320 is in contact with the back surface of the film layer 310; each anchoring portion 350 of the plurality of anchoring portions 350 is correspondingly arranged in each anchoring opening of the plurality of anchoring openings 440. Each passivation layer 330 of the plurality of passivation layers 330 corresponds to each leading electrode 320 of the plurality of leading electrodes 320 and is laid on the outer surface of the upper end of each leading electrode 320 of the plurality of leading electrodes 320; each passivation hole 430 of the plurality of passivation holes 430 corresponds to each back electrode of the plurality of back electrodes 340, and is opened in each passivation layer 330 of the plurality of passivation layers 330; each back electrode 340 of the plurality of back electrodes 340 corresponds to each leading electrode 320 of the plurality of leading electrodes 320 and is arranged on the outer surface of the upper end of each leading electrode 320 of the plurality of leading electrodes 320, and is correspondingly arranged right above the first supporting electrode 210.

The present disclosure provides a radio frequency filter, including: the substrate, the supporting electrode and the thin film structure; the supporting electrode is protruded on the front surface of the substrate; the thin film structure is formed on the substrate and spaced with the substrate by the supporting electrode. The end surface of the top end of the supporting electrode is in sealing contact with the front surface of the thin film structure. In the present disclosure, the technical bias in the art is overcome structurally, the conventional protective wafer substrate is replaced with the film layer, so that the effective packaging of the sealing cavity of the device may be achieved through the simple film lamination (corresponding to the film layer of the present disclosure) in the packaging of the radio frequency filter, the preparation process is significantly shortened, the production efficiency is improved, and the process flow is simplified; meanwhile, the use of the gold material is avoided, which significantly reduces the cost of the device and improves the device competitiveness; since the control of the distribution area of the leading electrodes on the back surface of the film layer may be achieved, and the heat dissipation efficiency of the device may be further improved; more importantly, the unexpected technical effect is achieved: the processing period of the packaged product is shortened by more than half, which is a milestone development in the history of the radio frequency filter device research and development.

The specific embodiments described above illustrate the objectives, technical solutions and beneficial effects of the present disclosure in further detail. It should be understood that the above are only specific embodiments of the present disclosure, and are not intended to limit the scope of the present disclosure. Any modifications, equivalent substitutions, improvements and the like made within the spirit and principle of the present disclosure should all fall within the protection scope of the present disclosure.

What is claimed is:

1. A radio frequency filter, comprising:
   a substrate;
   a supporting electrode protruded on a front surface of the substrate; and
   a thin film structure formed on the substrate and spaced with the substrate by the supporting electrode,
   wherein an end surface of a top end of the supporting electrode is in sealing contact with a front surface of the thin film structure, and the supporting electrode comprises:
   a first supporting electrode protruded outwardly with respect to the substrate on an edge of the front surface of the substrate, while the first supporting electrode is of an annular closed structure surrounding the edge of the front surface of the substrate; and
   a plurality of second supporting electrodes, each second supporting electrode of the plurality of second supporting electrodes is protruded with respect to the substrate on a middle portion of the front surface of the substrate, and the plurality of second supporting electrodes are surrounded by the first supporting electrode on the middle portion of the front surface of the substrate.

2. The radio frequency filter according to claim 1, wherein the supporting electrode further comprises:
   a first sealing structure arranged on an end surface of a top end of the first supporting electrode;
   a plurality of second sealing structures, each second sealing structure of the plurality of second sealing structures corresponds to each second supporting electrode of the plurality of second supporting electrodes, and is arranged on an end surface of a top end of each second supporting electrode of the plurality of second supporting electrodes;
   wherein the first sealing structure and each second sealing structure of the plurality of second sealing structures comprise a plurality of convex portions or concave portions arranged correspondingly, a height of the convex portion is t, a depth of the concave portion is a t $\geqslant$ 1 μm, and a $\geqslant$ 1 μm.

3. The radio frequency filter according to claim 1, wherein the supporting electrode further comprises:
   a first seed layer arranged between the first supporting electrode and the substrate;
   a plurality of second seed layers, each second seed layer of the plurality of second seed layers is correspondingly arranged between each second supporting electrode of the plurality of second supporting electrodes and the substrate;
   wherein a material of the first seed layer and each second seed layer of the plurality of second seed layers comprise titanium, tungsten, gold, copper or a combination thereof.

4. The radio frequency filter according to claim 1, further comprising:
   a protective cavity, wherein the protective cavity is a cavity space between the first supporting electrode, the plurality of second supporting electrodes, and the front surface of the substrate;
   wherein a distance between the front surface of the substrate and the end surface of the top end of the first supporting electrode is j1, a distance between the front surface of the substrate and the end surface of the top end of each second supporting electrode of the plurality of second supporting electrodes is j2, 10 μm ≤ j1 ≤ 40 μm, 10 μm ≤ j2 ≤ 40 μm; Δj=|j1−j2|, and Δj ≤ 10 μm.

5. The radio frequency filter according to claim 4, wherein the substrate comprises:
   a resonant structure corresponding to the protective cavity disposed on the front surface of the substrate;
   a plurality of lower electrode layers, each lower electrode layer of the plurality of lower electrode layers corresponds to a lower surface of each second supporting electrode of the plurality of second supporting electrodes, and is inwardly recessed with respect to the front surface of the substrate, a material of the lower electrode layer comprises copper, gold, molybdenum, aluminum or a combination thereof;
   wherein the resonant structure comprises at least:
   a piezoelectric layer corresponding to the protective cavity disposed on the front surface of the substrate.

6. The radio frequency filter according to claim 5, wherein the substrate further comprises:
   a plurality of spacing layers, each spacing layer of the plurality of spacing layers corresponds to the lower surface of each lower electrode layer of the plurality of lower electrode layers, and is arranged between each lower electrode layer of the plurality of lower electrode layers and the substrate,
   wherein a material of the spacing layer comprises titanium, tungsten, nickel, chromium or a combination thereof.

7. The radio frequency filter according to claim 1, wherein the thin film structure comprises:
   a film layer arranged on the substrate with the supporting electrode formed between the film layer and the substrate, the end surface of the top end of the supporting electrode is in sealing contact with a front surface of the film layer, a thickness of the film layer is m, and 10 μm ≤ m ≤ 60 μm;
   a plurality of through holes, each through hole of the plurality of through holes is arranged corresponding to a middle position of an end surface of a top end of each second supporting electrode of the plurality of second supporting electrodes, and penetrates through the film layer;
   a plurality of leading electrodes, each leading electrode of the plurality of leading electrodes is correspondingly filled in each through hole of the plurality of through holes, a lower end of each leading electrode of the plurality of leading electrodes is in contact with the end surface of the top end of each second supporting electrode of the plurality of second supporting electrodes, an upper end of each leading electrode of the plurality of leading electrodes is laid on a back surface of the film layer, an inner surface of the upper end of each leading electrode of the plurality of leading electrodes is in contact with the back surface of the film layer, a thickness of the upper end of each leading electrode of the plurality of leading electrodes on the back surface of the film layer is y, and 5 μm ≤ y ≤ 40 μm; and
   a plurality of back electrodes, each back electrode of the plurality of back electrodes corresponding to each leading electrode of the plurality of leading electrodes is arranged on an outer surface of the upper end of each leading electrode of the plurality of leading electrodes, and is correspondingly arranged right above the first supporting electrode, a height of the back electrode is b, and 30 μm ≤ b ≤ 150 μm;
   wherein an area of the back surface of the film layer is s1, a distribution area of the upper end of each leading electrode of the plurality of leading electrodes on the back surface of the film layer is s2, the number of the plurality of leading electrodes is n, Δs=(n×s2)/s1, and Δs ≥ 0.2.

8. The radio frequency filter according to claim 7, wherein the thin film structure further comprises:
   a plurality of passivation layers, each passivation layer of the plurality of passivation layers corresponds to each leading electrode of the plurality of leading electrodes, and covers the outer surface of the upper end of each leading electrode of the plurality of leading electrodes;
   a plurality of passivation holes, each passivation hole of the plurality of passivation holes corresponds to each back electrode of the plurality of back electrodes, and is opened in each passivation layer of the plurality of passivation layers.

9. The radio frequency filter according to claim 7, wherein the thin film structure further comprises:
   a plurality of anchoring openings correspondingly arranged above the first supporting electrode along an edge of the film layer, a projection size of the anchoring opening on the back surface of the film layer comprises a length c and a width k; c ≥ 40 μm, and k ≥ 10 μm;
   a plurality of anchoring portions, each anchoring portion of the plurality of anchoring portions correspondingly arranged in each anchoring opening of the plurality of anchoring openings, a thickness of the anchoring portion is d, and 5 μm ≤ d ≤ 40 μm.

10. The radio frequency filter according to claim 9, wherein each anchoring portion of the plurality of anchoring portions comprises:
   an anchor end correspondingly arranged in the anchoring opening;
   a fixed end correspondingly arranged on the back surface of the film layer;
   wherein the anchor end and the fixed end are connected with each other and are of an integral design.

* * * * *